(12) United States Patent
Ganusov et al.

(10) Patent No.: US 8,988,125 B1
(45) Date of Patent: Mar. 24, 2015

(54) CIRCUITS FOR AND METHODS OF ROUTING SIGNALS IN AN INTEGRATED CIRCUIT

(71) Applicant: Xilinx, Inc., San Jose, CA (US)

(72) Inventors: Ilya K. Ganusov, San Jose, CA (US); Manu Jose, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 14/056,154

(22) Filed: Oct. 17, 2013

(51) Int. Cl.
*H03H 11/26* (2006.01)
*H03K 5/14* (2014.01)

(52) U.S. Cl.
CPC .................................. *H03K 5/14* (2013.01)
USPC ........................................................ 327/261

(58) Field of Classification Search
USPC ........................................................ 327/261
See application file for complete search history.

(56) References Cited

U.S. PATENT DOCUMENTS

| 5,712,579 | A | 1/1998 | Duong et al. |
| 6,292,020 | B1 | 9/2001 | Crabill |
| 8,205,180 | B1 | 6/2012 | Anderson et al. |
| 8,264,261 | B2 * | 9/2012 | Grollitsch ............. 327/158 |
| 2008/0303568 | A1 * | 12/2008 | Werner et al. .......... 327/158 |

* cited by examiner

*Primary Examiner* — Daniel Rojas
(74) *Attorney, Agent, or Firm* — John J. King

(57) ABSTRACT

A circuit for routing signals in an integrated circuit is disclosed. The circuit comprises a path having a plurality of registers coupled in series and including a source register, a destination register and at least one intermediate register; a clock generator generating a clock signal; and a delay element coupled to receive the clock signal and generate a delayed clock signal, wherein the delayed clock signal is coupled to a clock input of the at least one intermediate register. A method of routing signals in an integrated circuit is also disclosed.

20 Claims, 10 Drawing Sheets

US 8,988,125 B1

CIRCUITS FOR AND METHODS OF ROUTING SIGNALS IN AN INTEGRATED CIRCUIT

TECHNICAL FIELD

The present invention relates generally to integrated circuit devices, and in particular, to circuits for and methods of routing signals in an integrated circuit device.

BACKGROUND

Signals in digital circuits typically have one driver pin and one or more load pins. A logic transition on a signal during circuit operation commences at the driver of the signal and is received at a load pin at some point later in time. The propagation delay from a signal driver to the load pin depends on the routing topology, capacitance, and buffering in the signal path. The propagation delay from the signal driver to a load may vary based upon a selected path. This important signal transmission property, called the signal "skew," is the difference in propagation delay of a signal routed to a load in different paths. Similarly, "clock skew" refers to skew on the clock network. Clock skew can have a considerable impact on the performance of sequential logic circuits, and can often reduce the performance of sequential circuits by reducing the permissible propagation time for combinational paths.

In synchronous logic, a pipeline stage with the longest data path delay limits the maximum frequency (Fmax) of the entire design, even if the previous or next pipeline stages are very fast. Conventionally, clock skew is added by introducing a programmable delay element before the clock pin of the target register. The area required for implementing the delay grows linearly with the number of registers and a maximum delay, which significantly increases the cost of an integrated circuit device transmitting data.

SUMMARY

A circuit for routing signals in an integrated circuit device is disclosed. The circuit comprises a path having a plurality of registers coupled in series and including a source register, a destination register and at least one intermediate register; a clock generator generating a clock signal; and a delay element coupled to receive the clock signal and generate a delayed clock signal, wherein the delayed clock signal is coupled to a clock input of the at least one intermediate register.

Another circuit for routing signals in an integrated circuit device comprises a clock generator; a clock tree coupled to the clock generator, the clock tree having a plurality of clock branches; a plurality of registers of a data path coupled in series, each register having a clock input for receiving a clock signal; and programmable interconnect elements coupled to the clock tree, the programmable interconnect elements routing a delayed clock signal to an intermediate register of the plurality of registers.

A method of routing signals in an integrated circuit is also described. The method comprises coupling a plurality of registers, including a source register, a destination register and at least one intermediate register, in series; generating a clock signal; coupling the clock signal to a delay element to generate a delayed clock signal; and coupling the delayed clock signal to a clock input of the at least one intermediate register.

DETAILED DESCRIPTION

Figure 1:
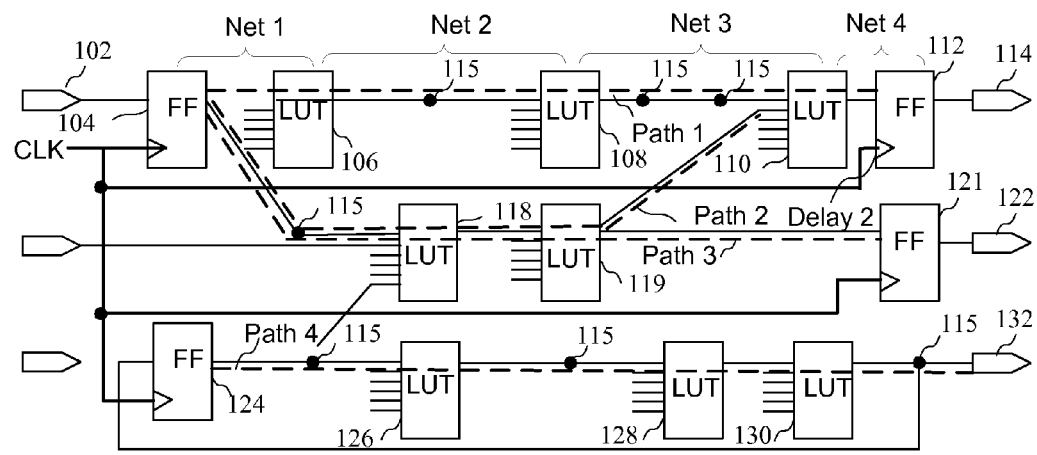
FIG. 1 is block diagram showing data paths in a circuit of an integrated circuit device.

Turning first to FIG. 1, a block diagram shows data paths in a circuit of an integrated circuit device. In particular, FIG. 1 shows various nets and paths between registers. As will be described in more detail below, the delay values associated with transmitted data may be based upon nets or paths, for example. A net represents a collection of interconnect segments from the output of a user logic block such as a lookup table to inputs of the next destination user logic block, while a path represents a sequence of nets between registers comprising a connection from a source register to a load or destination register. A path may be defined as a clock-to-clock path, such as a path from one register to another register, a register to an output, an input to a register, or an input to an output, as is well known in the art. While FIG. 1 is shown in terms of lookup tables, it should be understood that other logic blocks may be used, such as those logic blocks defined in more detail in reference to FIG. 10.

FIG. 1 shows various arrangements of registers and LUTs in various paths. An input/output (I/O) port 102, which may comprise an input for receiving data, is coupled to an input of a register 104, shown here as a flip-flop (FF), the output of which is coupled to an input of a LUT 106. Some inputs of LUTs and flip-flops in FIG. 1 are shown without nets attached. These nets may connect to other nets, LUTs or flip-flops, but are omitted for clarity. The output of the LUT 106 is coupled to a second LUT 108, the output of which is coupled to a third LUT 110. The output of the LUT 110 is coupled to a register 112 which is coupled to an I/O port 114.

By way of example, there are four nets associated with a Path 1 which extends from register 104 to register 112 by way of LUT 106, LUT 108 and LUT 110. Also shown by way of example, a first net (Net 1) is defined between register 104 and the LUT 106. A second net (Net 2) is defined between LUT 106 and LUT 108, and comprises one interconnect point 115 connecting two interconnect segments. The interconnect point may comprise a programmable interconnect point (PIP) which will be described in more detail below in reference to FIG. 2. In contrast, a third net (Net 3) extending from the LUT 108 to the LUT 110 comprises two interconnect points connecting interconnect segments. Finally, a fourth net is defined between the LUT 110 and the register 112.

A second path, Path 2, between the register 104 and the register 112 is shown extending through LUTs 118 and 119 by way of an interconnect point, and back to LUT 110. While Path 1 and Path 2 have the same number of LUTs between the same registers, they extend through different LUTs and interconnect points. A third path, Path 3, extends from register 104, through LUTs 118 and 119 to a register 121, the output of which is coupled to an I/O port 122. The output of a register 124 is coupled by way of LUTs 126-130 to an I/O port 132, as shown by Path 4. A feedback loop is also shown, which would be considered a separate path. The interconnect multiplexers of FIG. 1 described in more detail below may be used as interconnect points to provide input flexibility between a general interconnect structure and configurable logic elements. As described above, the connection from the output of one LUT to the input of another LUT may be established by a number of different nets which may comprise different delays. While nets may be selected to meet a minimum delay, multiple resources may compete for the same resources, making efforts to meet a delay requirement challenging.

A clock signal is coupled to each of the registers, as is well known in the art. In the circuit of FIG. 1, the clock signal CLK is shown coupled to registers 104 and 112. Timing analysis is performed to determine a timing slack value for each connection in the design. A placer optimizes the design based on the timing slacks. In particular, connections with negative slack (i.e., when the estimated delay is greater than the allowed propagation time) are not meeting design constraints, and the placer aims to reduce the delays of such connections. On the other hand, when there is competition for the paths having the best delays, then the connections with positive slack (i.e., when the estimated delay is less than the allowed propagation time) are already meeting design constraints, and can perhaps be routed through alternative paths that experience longer delays, if needed, to allow for an improvement in negative slack connections. However, as will be described in more detail below, a delay associated with an intermediate register may be implemented.

Figure 2:
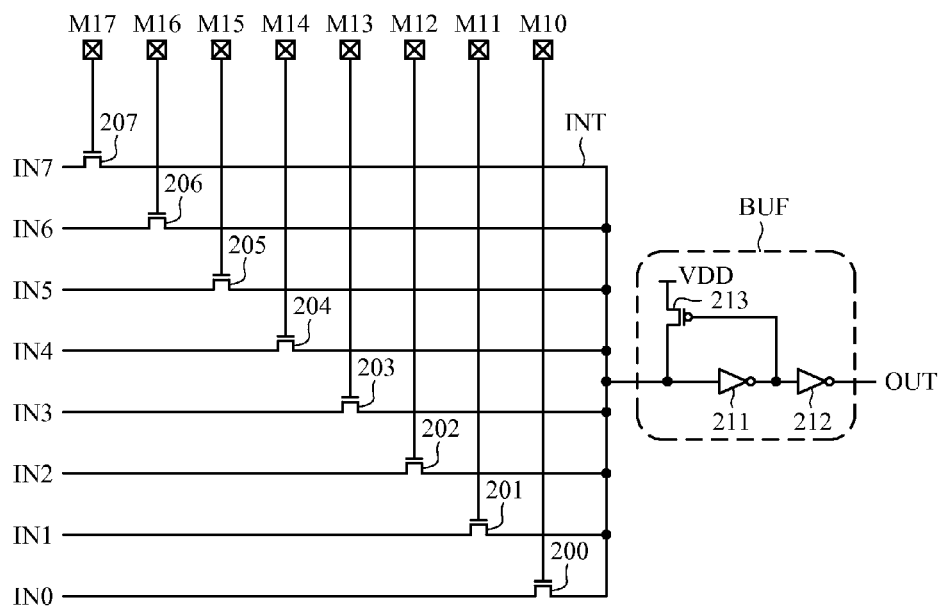
FIG. 2 is block diagram of a programmable interconnect point.

Turning now to FIG. 2, a block diagram of a programmable interconnect point is shown. Programmable interconnect points are often coupled into groups that implement multiplexer circuits selecting one of several interconnect lines to provide a signal to a destination interconnect line or logic block. A routing multiplexer can be implemented, for example, as shown in FIG. 2. The illustrated circuit selects one of several different input signals and passes the selected signal to an output terminal.

The circuit of FIG. 2 includes eight input terminals IN0-IN7 and eight pass gates 200-207 that selectively pass one of signals IN0-IN7, respectively, to an internal node INT. Each pass gate 200-207 has a gate terminal driven by a configuration memory cell M10-M17, respectively. The signal on internal node INT is buffered by buffer BUF to provide output signal OUT. Buffer BUF includes two inverters 211, 212 coupled in series, and a pull up (e.g., a P-channel transistor 213 to power high VDD) on internal node INT and driven by the node between the two inverters.

Clearly, at most one of configuration memory cells M10-M17 can be configured with a high value at any given time. Other configurations are not supported by the circuit. The one configuration memory cell with a high value selects the associated input signal IN0-IN7 to be passed to internal node INT, and hence to output node OUT. If none of memory cells M10-M17 is configured with a high value, output signal OUT is held at its initial high value by pull-up 213.

The various circuits set forth below improve the area efficiency of a circuit for transmitting data by implementing programmable clock skew in an integrated circuit. Programmable clock skew allows time borrowing in portions of a data path to improve a maximum frequency (Fmax) and decrease hold time violations for an application mapped onto an integrated circuit, such as a Field Programmable Gate Array (FPGA). More particularly, the circuits and methods enable the placement and connectivity of programmable delay elements along the clocking resources provided by an FPGA. The selective placement of a delay element in a data path can drastically reduce area and power overheads of programmable clock delays compared with conventional approaches.

The time borrowing techniques set forth below improve the Fmax of such designs by intentionally skewing the clock in a way that a most critical pipeline stage effectively borrows extra slack from a less critical pipeline stage. Accordingly, the total area of programmable delays is reduced by placing programmable delays along FPGA clocking resources instead of clock pins of a destination register. While delaying clock resources may reduce performance potential because it delays clock to all registers after programmable delay element, phase-shifted copies of the original clock may be introduced and distributed to consumers on unused clock tracks to minimize the reduction in performance potential.

By placing programmable delays at the "branches" of the clocking tree instead of tree "leaves," less area overhead is required. Since clock trees have fewer branches than leaves, this approach results in fewer total delay elements per integrated circuit device and, therefore, lower costs. The selective placement of delays also reduces extra leakage power from programmable delays because there are less of them. It can also reduce dynamic power because there is no switching from extra multiplexing at every leaf. Because clock tree resources are underutilized in many circuit designs, unused clock tree resources can be used to distribute phase-shifted versions of the original clocks to improve performance.

Figure 3:
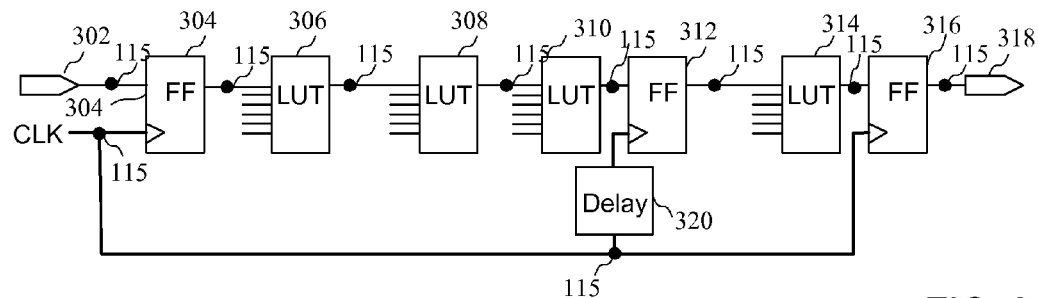
FIG. 3 is block diagram of a data path having a delayed clock signal coupled to an intermediate register of a data path.

Turning now to FIG. 3, a block diagram of a data path having a delayed clock signal coupled to an intermediate register of a data path is shown. In particular, an input terminal 302 is coupled to receive a data signal which is coupled to various elements of the data path connected by various programmable interconnect points 115. The input terminal 302 is coupled to a register 304, shown here by way of example as a flip flop (FF), the output of which is coupled to a look-up table (LUT) 306. An output of the LUT 306 is coupled to an input of the LUT 308. Another LUT 310 is also implemented in a first pipelined portion of the data path between the register 304 and a second register 312. A LUT 314 of a second portion of the data path is coupled between the register 312 and a register 316, which generates an output signal at an output 318.

A delay element 320 is implemented to provide a delayed clock signal to a clock input of the register 312. That is, while the clock signal (CLK) is provided to clock terminals of each of the registers 304 and 316, the delayed clock signal provided to the register 312 enables the portion of the path between the register 304 and the register 312 to borrow timing slack from the portion of the path between the register 312 and the register 316. In the two portions of the path between register 304 and register 316, if one of the paths is more critical, timing slack can be borrowed from the other path to make the critical path less critical. For example, if the time required for a signal to be routed on the first portion of the path between register 304 and register 312 is 2 nanoseconds (ns), and the time required for the signal to be routed on the second portion of the path between register 316 is 1 ns, a delay of 0.5 ns coupled be provided by the delay element 320 so that the effective timing in both the first path and the second path is 1.5 ns. More particularly, in the more critical first path register 304 and register 312, by delaying the clock signal to the clock terminal of the register 312, the time necessary for a signal to be routed from the register 304 and the register 312 is effectively 1.5 ns. While the delayed clock signal to the register 312 makes the path register 312 and register 316 more critical reducing the time available for the signal to be routed between register 312 and register 316, the path between register 312 and register 316 is shorter, and the signal will satisfy the timing requirement. By providing the delay element 320 as shown, a higher frequency clock signal can be used. For example, a clock having maximum frequency Fmax (i.e., which would enable the signal to be routed between the register 304 and the register 312 but could not be otherwise used because of necessary hold times for the registers) could be used in the circuit. Without the delay, the circuit would have to use a clock signal having a lower frequency than maximum frequency Fmax.

While only a single intermediate register is implemented between a source register and a destination register, shown in FIG. 3 as registers 304 and 316, it should be understood that a number of intermediate registers could be implemented between source and destination registers, and the delay could be provided to the intermediate register which would provide the optimal timing for the transmission of data in the data path, as will be described in more detail below.

Figure 4:
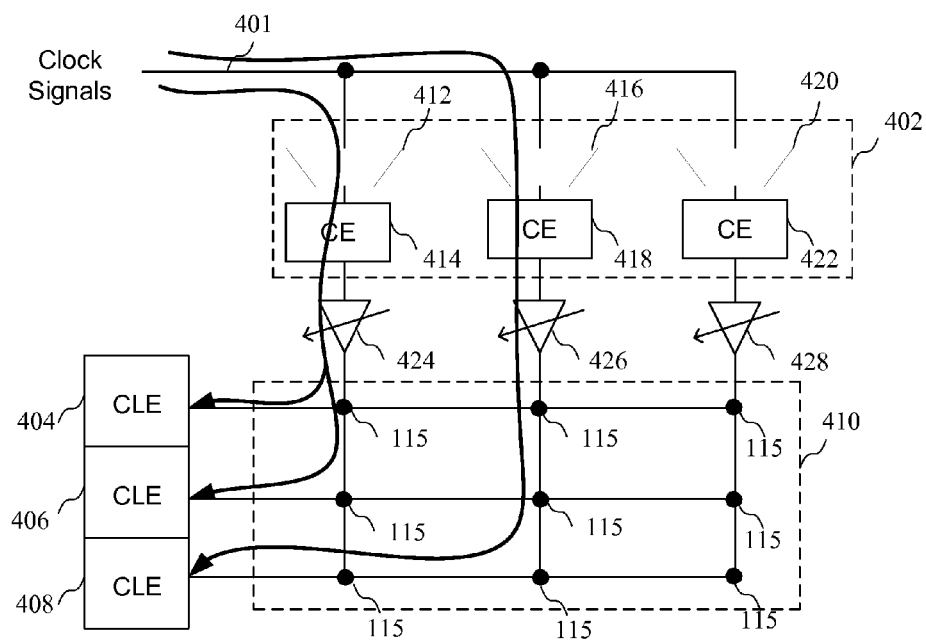
FIG. 4 is a block diagram of a circuit enabling the routing of selected clock signals to programmable resources of an integrated circuit.

Turning now to FIG. 4, a block diagram of a circuit enabling the routing of selected clock signals to programmable resources of an integrated circuit is shown. Clock signals on a clock bus 401 are coupled to a selection circuit 402 enabling the selection of a clock signal which may then be selectively routed to programmable resources, shown here as configurable logic elements (CLEs) 404-408 by way of a routing network 410. In particular, the routing network may include a number programmable interconnect elements 115 which would be configured to enable the routing of any of the selected clock signals to any of the CLEs. The various clock signals on the clock bus 401 could be phase shifted versions of the same clock signal, for example, or could be independent clock signals. The selection circuit 402 comprises a plurality of multiplexers and corresponding clock enable circuits, shown here as a multiplexer 412 and corresponding clock enable circuit 414, a multiplexer 416 and corresponding clock enable circuit 418, and a multiplexer 420 and corresponding clock enable circuit 422. As will be described in more detail below, the clock enable circuits enable a user to reduce power consumption by selectively disabling a clock which might otherwise be provided to a programmable resource to reduce power consumption.

The circuit of FIG. 4 also includes delay elements 424, 426, and 428 at the outputs of the selection circuit. The delay elements 424, 426, and 428 are programmable delay elements which enable setting a desirable delay. As will also be described in more detail below, each of the delay elements can be individually set to a desired delay value based upon the function of the circuit implemented in the CLEs. As shown in FIG. 4, a clock signal selected by the multiplexer 412 and delayed by delay element 424 is routed to CLEs 404 and 406, while a clock signal selected by the multiplexer 416 and delayed by delay element 426 is routed to CLE 408. An example of a CLE will be described in more detail in reference to FIG. 12. According to one implementation, the delay element 424 could be bypassed, and the same clock signal could be selected by multiplexers 412 and 416 to generate a variation in the clock signal which has high resolution. That is, rather than selecting a different phase of the clock signal, the same clock signal is selected by the multiplexers 412 and 416 (i.e., the clock signal is duplicated), and a programmable delay is provided by the delay element 426 to adjust the timing of the portions of the data path. Because the delay provided by the delay element may be less than a delay resulting from a phase shift, the resolution of the delay capability is greater, providing greater timing optimization in the circuit.

Figure 5:
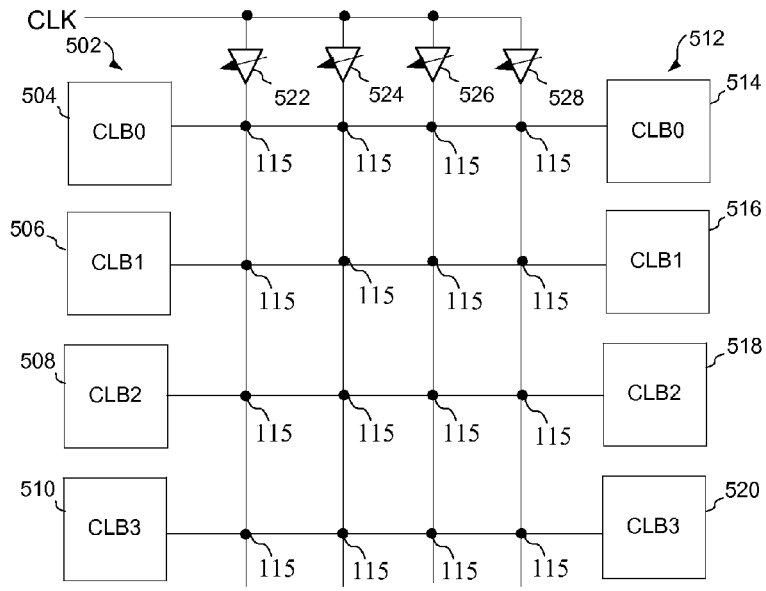
FIG. 5 is a block diagram showing an arrangement of delay elements and configurable resources in an integrated circuit.

Turning now to FIG. 5, a block diagram shows an arrangement of delay elements and configurable resources in an integrated circuit. As shown in FIG. 5, selected clock signals are routed to configurable logic blocks (CLBs) which are arranged in columns with a plurality of branches of a clock tree extending between the columns. As will be described in more detail in reference to FIGS. 11 and 12, CLEs are implemented in CLBs. A first column 502 having CLBs 504-510 and a second column 512 having CLBs 514-520 are positioned on opposite sides of clock tree branches which are driven by delay elements 522-528, where programmable interconnect points 115 enable, for each of the CLBs, the selective routing of a delayed clock signal. Accordingly, any of the delayed clock signals provided to the clock tree branch can be routed to any of the CLBs.

Figure 6:
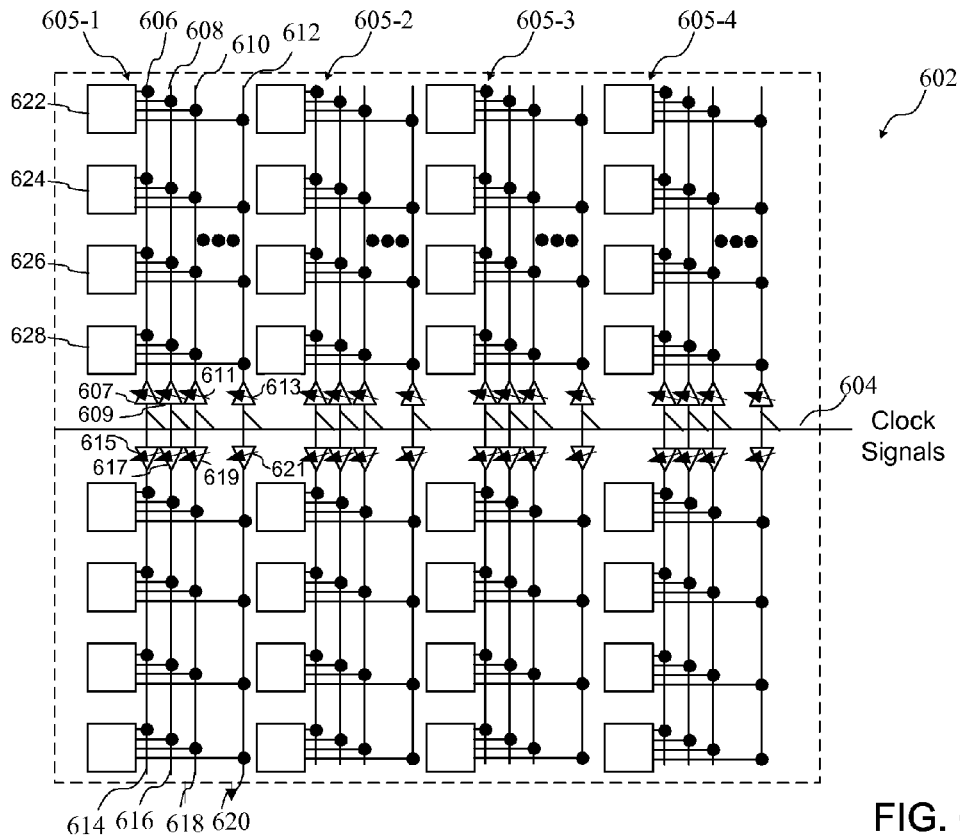
FIG. 6 is a block diagram showing an arrangement of a clock tree and programmable resources of an integrated circuit.

As shown in FIG. 6, a clock tree can be provided where a plurality of clock signals is routed to a plurality of branches which are routed to various columns of CLEs. More particularly, a portion 602 of a circuit has a clock bus 604 which has a plurality of clock lines or clock branches. The clock bus 604 extends between upper and lower portions of the circuit having CLEs arranged in columns 605-1 through 605-4. Each of the branches of the clock tree routed to the upper portion of the circuit or the lower portion of the circuit is controlled by a corresponding delay element. In particular, the clock signal of the plurality of clock signals routed to the clock branch 606 is delayed by a delay element 607. Similarly, the clock signals routed to the clock branches 608, 610, and 612 are delayed by delay elements 609, 611 and 613, respectively. Further, on the bottom portion of the circuit, the clock signals routed to the clock tree branches 614, 616, 618, and 620 are delayed by delay elements 615, 617, 619 and 621, respectively. The plurality of clock signals may be phase shifted versions of a common clock signal, or may be independent clock signals. While the description of the upper and lower portions are provided in detail with respect to column 605-1, it should be understood that the routing of clock signals is the same in columns 605-2 through 605-4, but where each delay element to each clock branch is independently controllable.

Because a given delay element may be provided to more than one element, the delay set for the delay element may be selected to accommodate the path having the worst case timing (i.e., the tightest timing constraints) for each element receiving a delayed clock signal associated with the delay element. By way of example, in the arrangement of FIG. 6, the delayed clock signal generated by delay element 607 may be routed to CLEs 622 and 626 of a leaf column having CLEs 622-628, while the delayed clock signal generated by the delay element 609 may be routed to the CLEs 624 and 628. The delay of the delay element 607 would be selected to accommodate the more critical path between the paths having CLEs 622 and 626, while the delay of the delay element 609 would be selected to accommodate the more critical path between the paths having CLEs 624 and 628.

Figure 7:
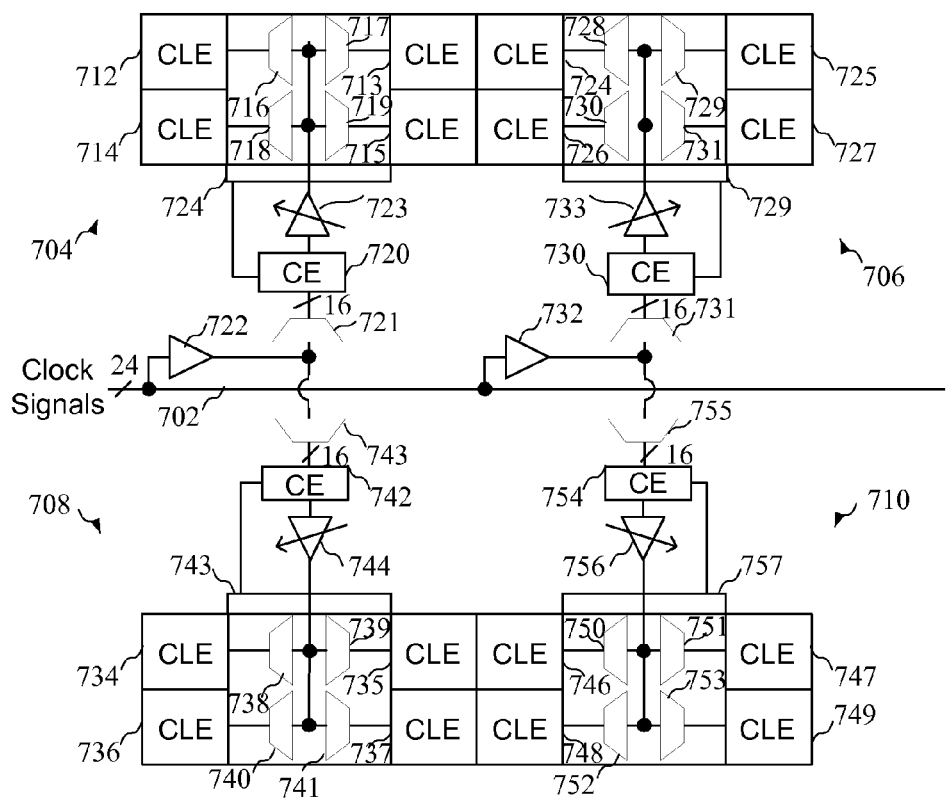
FIG. 7 is a block diagram showing an arrangement of routing circuits enabling the selection of a clock signal for programmable resources of an integrated circuit.

Turning now to FIG. 7, a block diagram shows an arrangement of routing circuits which enable the selection of a clock signal for programmable resources of an integrated circuit. The block diagram of FIG. 7 provides an efficient layout of elements which enables selectively routing clock signals to CLEs. The circuit arrangement of FIG. 7 also provides a clock tree having clock branches which extend above and below a clock bus 702, where the clock tree provides clock signals to a plurality of portions 704-710 as shown. A first portion 704 comprises CLEs 712-715 which are provided with a selected clock signal by the corresponding multiplexers 716-719. A clock enable circuit 720 is coupled to a multiplexer 721 which receives the plurality of clocks on the clock bus by way of a buffer 722. By way of example, 24 clock signals may be provided on the clock bus, where 16 of the clock signals may be selected by the multiplexer 721. A delay element 723 delays the clock signals output by the multiplexer 721. One or more delayed clock signals of the plurality of delayed clock signals generated by the multiplexer 721 are independently selected by the multiplexers 716-719 for the CLEs 712-715, respectively. A control circuit 724 is coupled to control the clock enable circuit 720. As set forth above, the clock enable circuit 720 enables selectively disabling portions of a circuit, such as an entire portion 704 in the circuit of FIG. 7.

The second portion 706 comprises CLEs 724-727 which are provided with a selected clock signal by the corresponding multiplexers 728-731. A clock enable circuit 730 is coupled to a multiplexer 731 which receives the plurality of clocks on the clock bus by way of a buffer 732. A delay element 733 delays the clock signals output by the multiplexer 731. One or more delayed clock signals of the plurality of delayed clock signals generated by the multiplexer 731 are independently selected by the multiplexers 716-719. A control circuit 729 is coupled to control the clock enable circuit 730. As shown in FIG. 7, CLEs of the portion 704 are adjacent to CLEs of the portion 706, providing an efficient layout of elements, where multiplexers for each of the portions are provided to select signals for CLEs in columns associated with each of the portions.

The circuit portions 708 and 710 below the clock tree are also arranged as the circuit portions 704 and 706. In particular, the third portion 708 comprises CLEs 734-737 which are provided with a selected clock signal by the corresponding multiplexers 738-741. A clock enable circuit 742 is coupled to a multiplexer 743 which receives the plurality of clocks on the clock bus by way of the buffer 722. A delay element 744 delays the clock signals output by the multiplexer 743. A delayed clock signal of the plurality of delayed clock signals generated by the multiplexer 743 is independently selected by the multiplexers 738-741. Similarly, the fourth portion 710 comprises CLEs 746-749 which are provided with a selected clock signal by the corresponding multiplexers 750-753. A clock enable circuit 754 is coupled to a multiplexer 755 which receives the plurality of clocks on the clock bus by way of a buffer 732. A delay element 756 delays the clock signals output by the multiplexer 755. A delayed clock signal of the plurality of delayed clock signals generated by the multiplexer 755 is independently selected by the multiplexers 750-753.

Figure 8:
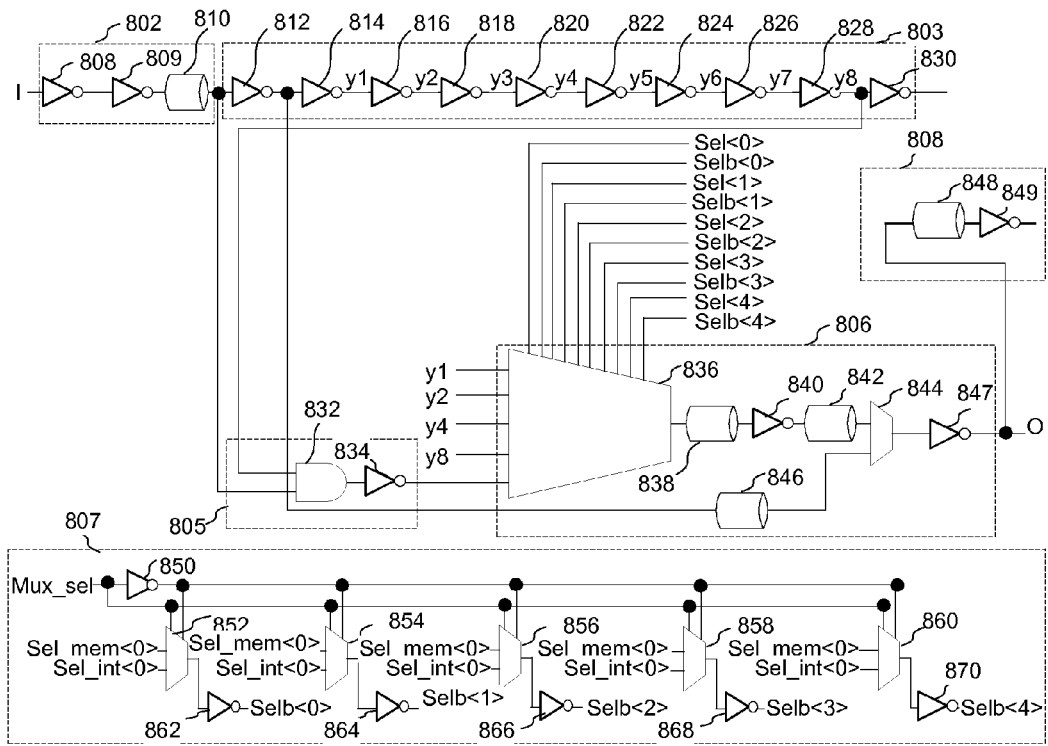
FIG. 8 is block diagram of a delay element which may be implemented in the circuits of FIGS. 3-7.

Turning now to FIG. 8, block diagram of a delay element which may be implemented in the circuits of FIGS. 3-7 is shown. The delay element of FIG. 8 comprises a driver circuit 802 coupled to receive an input signal I. The driver circuit 802 is coupled to a delay line 803. Outputs of the delay line are selected by a delay tap mux 806 which is controlled by a pulse generator 805 and a control circuit 807. The output of the delay tap mux 806 is coupled to a load circuit 808.

The driver stage 802 comprises a pair of series inverters 808 and 809 coupled to a resistor-capacitor (RC) circuit 810, the output of which is coupled to the delay line 803. The delay line 803 comprises a series of inverters 812-830 which generate signals (based upon the input signal I) having varying delays. As will be described in more detail below, predetermined delayed values y1-y8 may be selected based upon signals generated by the control circuit 807. The delay tap mux 805 comprises an AND gate 832 coupled to receive the output of the driver circuit 802 and delayed output y8 of the inverter 828. An output of the AND gate 832 is coupled to an inverter 834, the output of which is provided to an input of a multiplexer 836. The delay tap mux 805 provides a pulse which is the width of the delay line which enables the use of latches instead of flip flops to provide improved performance if desired.

The multiplexer 836 is coupled to receive a plurality of outputs of the delay line 803 which could be selected in response to control signals. The control signals are generated by the control circuit 807, as will be described in more detail below. The output of the multiplexer 836 is coupled to a series configuration of an RC network 838, and inverter 840 and another RC network 842. The output of the RC network 842 is coupled to an inverter 844, which is also coupled to receive an output of an RC network 846. Accordingly, the multiplexer 844 enables the selection of a delayed signal, or the passing of the data at the output of the inverter 812 without delay, to an inverter 847 as an output signal O. The output of the delay tap mux 806 is coupled to the load 808 having an RC circuit 848 and an inverter 849.

The control circuit 807 receives a mux select signal, and generates a plurality of select and inverted select signals. In particular, the mux select signal and an inverted mux select signal generated at the output of an inverter 850 are coupled to control terminals of a plurality of multiplexers 852-860, each of which receives a corresponding select signal from a memory (Sel_mem<x>) or a select signal from a test circuit (Sel_int<x>). Inverters at the outputs of the multiplexers 852-860 generate inverted select signals which control the multiplexer 836 to generate a delay signal. By storing the Sel_mem<x> values in memory, a delay provided by the delay circuit can be programmably set.

Figure 9:
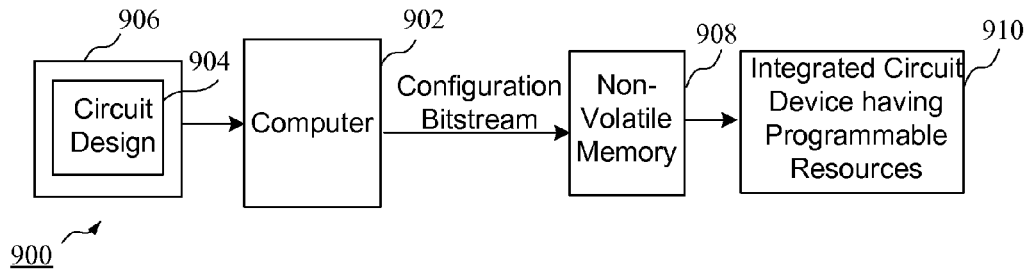
FIG. 9 is a block diagram of a system for programming a device having programmable resources.

Turning now to FIG. 9, a block diagram of a system for programming a device having programmable resources according to an embodiment is shown. In particular, a computer 902 is coupled to receive a circuit design 904 from a memory 906, and generates a configuration bitstream which is stored in the non-volatile memory 906. As will be described in more detail below, the circuit design may be a high level design, such as a circuit design defined in a hardware description language (HDL). Also, the computer may be configured to run software that generates a configuration bitstream which is stored in the non-volatile memory 908 and provided to an integrated circuit 910 which may be a programmable integrated circuit, such as the integrated circuit described below in FIG. 9. As will be described in more detail below, bit of the configuration bitstream are used to configure programmable resources of the integrated circuit.

Figure 10:
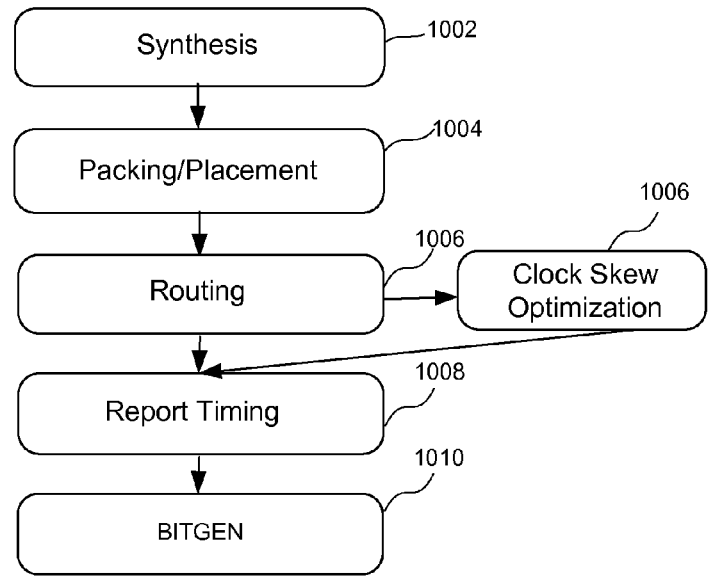
FIG. 10 is flow diagram showing the generation of a configuration bitstream.

Turning now to FIG. 10, a flow diagram showing the generation of a bitstream for programming the programmable resources of an integrated circuit is shown. The software flow for implementing a circuit design in a device having programmable resources includes synthesis, packing, placement, and routing. Synthesis comprises converting a circuit design in a high-level design to a configuration of the elements found in the device which is to receive the circuit design. For example, a synthesis tool operated by the computer 902 may implement portions of a circuit design enabling certain functions in CLBs or DSP blocks, as will be described in more detail below. An example of a synthesis tool which may implement conventional methods of synthesis, packing, placement and routing is the ISE tool available from Xilinx, Inc. of San Jose Calif.

Packing and placement is performed at a stage 1004. Packing comprises grouping portions of the circuit design into defined blocks, such as CLBs, of a device. Placing comprises determining the location of the blocks of the device to receive the circuits defined during packing, wherein the blocks in a design may be placed on the two-dimensional grid associated with specific elements of the device. Placement is performed by a placer, which may include placement software running on a computer, or a portion of a larger software package running on a computer for implementing a circuit design in a device. Finally, routing comprises selecting paths of interconnect elements, such as programmable interconnects in a device having programmable elements. Clock skew optimization, where delay elements may be added to clock paths as described above, is then performed at a block 1006. The timing is reported at a block 1008, and a bitstream is generated at a block 1010.

Figure 11:
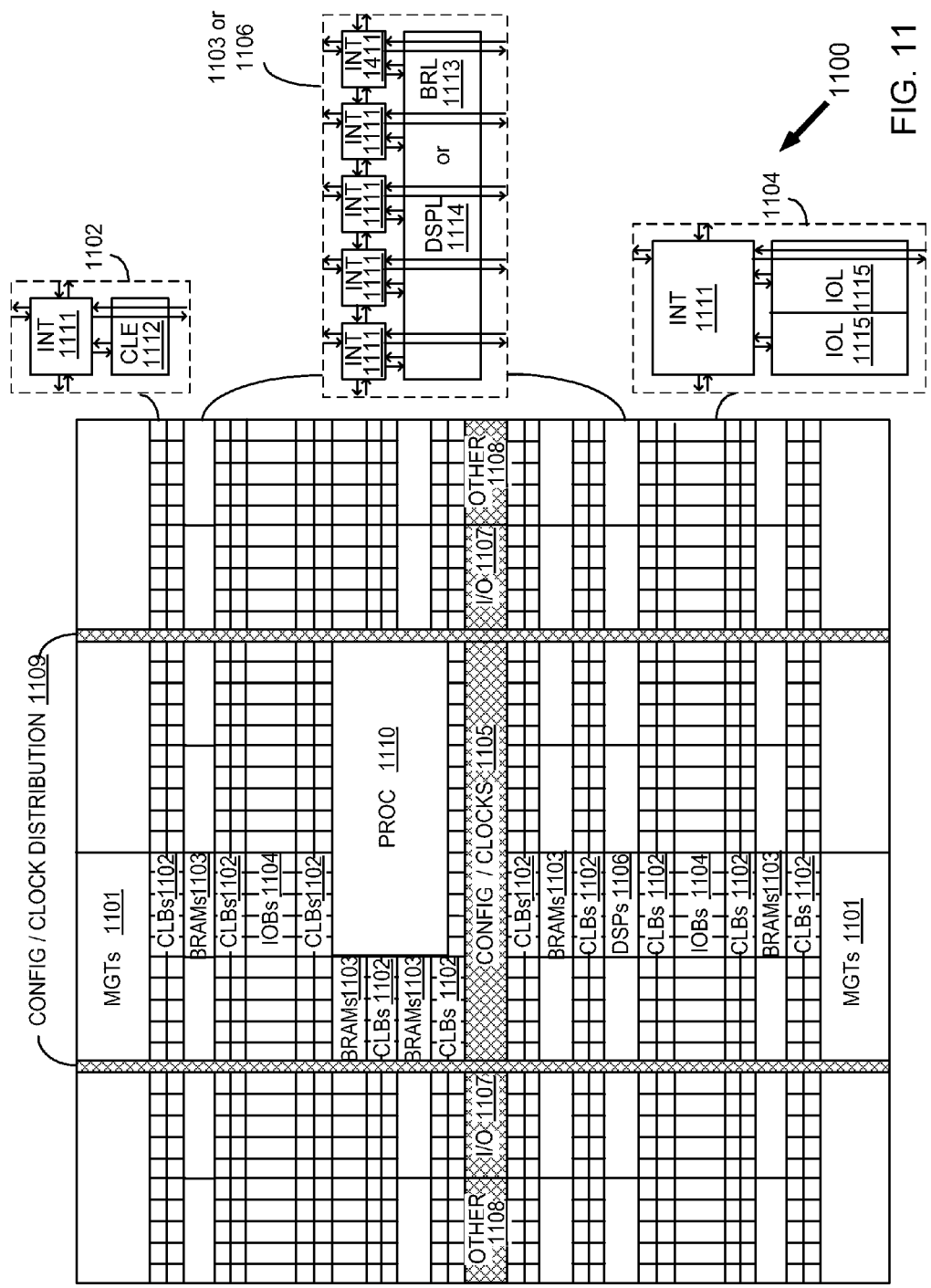
FIG. 11 is a block diagram of a device having programmable resources which may implement the circuits of FIGS. 1-7.

Turning now to FIG. 11, a block diagram of a device having programmable resources including the circuits of FIGS. 1-9 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 11 comprises an FPGA architecture 1100 having a large number of different programmable tiles including multi-gigabit transceivers (MGTs) 1101, CLBs 1102, random access memory blocks (BRAMs) 1103, input/output blocks (IOBs) 1104, configuration and clocking logic (CONFIG/CLOCKS) 1105, digital signal processing blocks (DSPs) 1106, specialized input/output blocks (I/O) 1107 (e.g., configuration ports and clock ports), and other programmable logic 1108 such as digital clock managers, analog-to-digital converters, system monitoring logic, and so forth. Some FPGAs also include dedicated processor blocks (PROC) 1110, which may be used to implement a software application, for example.

In some FPGAs, each programmable tile includes a programmable interconnect element (INT) 1111 having standardized connections to and from a corresponding interconnect element in each adjacent tile. Therefore, the programmable interconnect elements taken together implement the programmable interconnect structure for the illustrated FPGA. The programmable interconnect element 1111 also includes the connections to and from the programmable logic element within the same tile, as shown by the examples included at the top of FIG. 11.

For example, a CLB 1102 may include a configurable logic element (CLE) 1112 that may be programmed to implement user logic plus a single programmable interconnect element 1111. A BRAM 1103 may include a BRAM logic element (BRL) 1113 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 1106 may include a DSP logic element (DSPL) 1114 in addition to an appropriate number of programmable interconnect elements. An IOB 1104 may include, for example, two instances of an input/output logic element (IOL) 1115 in addition to one instance of the programmable interconnect element 1111. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. The config/clock distribution regions 1109 extending from this column are used to distribute the clocks and configuration signals across the breadth of the FPGA. Some FPGAs utilizing the architecture illustrated in FIG. 11 include additional logic blocks that disrupt the regular columnar structure making up a large part of the FPGA. The additional logic blocks may be programmable blocks and/or dedicated logic. For example, the processor block PROC 1110 shown in FIG. 11 spans several columns of CLBs and BRAMs.

Note that FIG. 11 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 11 are purely exemplary. For example, in an actual FPGA more than one adjacent column of CLBs is typically included wherever the CLBs appear in order to facilitate the efficient implementation of user logic. While the embodiment of FIG. 11 relates to an integrated circuit having programmable resources, it should be understood that the circuits and methods set forth in more detail below could be implemented in any type of ASIC.

Figure 12:
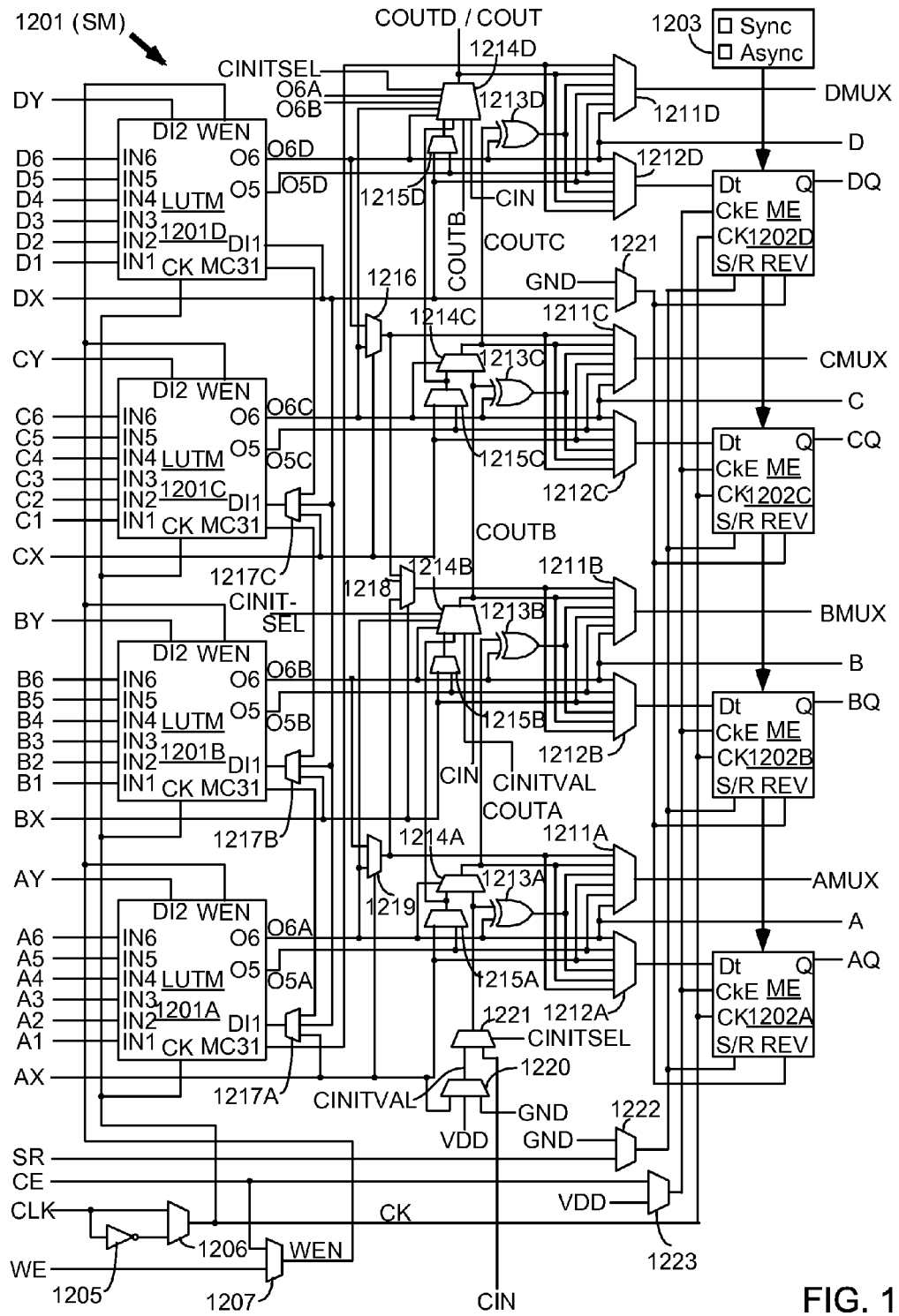
FIG. 12 is a block diagram of a configurable logic element of the device of FIG. 11.

Turning now to FIG. 12, block diagram of a configurable logic element of the device of FIG. 11 is shown. In particular, FIG. 12 illustrates in simplified form a configurable logic element of a configuration logic block 1102 of FIG. 11. In the embodiment of FIG. 12, slice M 1201 includes four lookup tables (LUTMs) 1201A-1201D, each driven by six LUT data input terminals A1-A6, B1-B6, C1-C6, and D1-D6 and each providing two LUT output signals O5 and O6. The O6 output terminals from LUTs 1201A-1201D drive slice output terminals A-D, respectively. The LUT data input signals are supplied by the FPGA interconnect structure via input multiplexers, which may be implemented by programmable interconnect element 1211, and the LUT output signals are also supplied to the interconnect structure. Slice M also includes: output select multiplexers 1211A-1211D driving output terminals AMUX-DMUX; multiplexers 1212A-1212D driving the data input terminals of memory elements 1202A-1202D; combinational multiplexers 1216, 1218, and 1219; bounce multiplexer circuits 1222-1223; a circuit represented by inverter 1205 and multiplexer 1206 (which together provide an optional inversion on the input clock path); and carry logic having multiplexers 1214A-1214D, 1215A-1215D, 1220-1221 and exclusive OR gates 1213A-1213D. All of these elements are coupled together as shown in FIG. 12. Where select inputs are not shown for the multiplexers illustrated in FIG. 12, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 12 for clarity, as well as from other selected figures herein.

In the pictured embodiment, each memory element 1202A-1202D may be programmed to function as a synchronous or asynchronous flip-flop or latch. The selection between synchronous and asynchronous functionality is made for all four memory elements in a slice by programming Sync/Asynch selection circuit 1203. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1202A-1202D are clocked by a clock signal CK, which may be provided by a global clock network or by the interconnect structure, for example. Such programmable memory elements are well known in the art of FPGA design. Each memory element 1202A-1202D provides a registered output signal AQ-DQ to the interconnect structure. Because each LUT 1201A-1201D provides two output signals, O5 and O6, the LUT may be configured to function as two 5-input LUTs with five shared input signals (IN1-IN5), or as one 6-input LUT having input signals IN1-IN6.

In the embodiment of FIG. 12, each LUTM 1201A-1201D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1217A-1217C for LUTs 1201A-1201C), or to the two 32-bit RAMs via input terminals DI1 and DI2. RAM write operations in the LUT RAMs are controlled by clock signal CK from multiplexer 1206 and by write enable signal WEN from multiplexer 1207, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1201A may also be provided to the general interconnect structure for shift register chaining, via output select multiplexer 1211D and CLE output terminal DMUX. Accordingly, the circuits and methods set forth above may be implemented in a device such as the devices of FIGS. 12 and 12, or any other suitable device.

Figure 13:
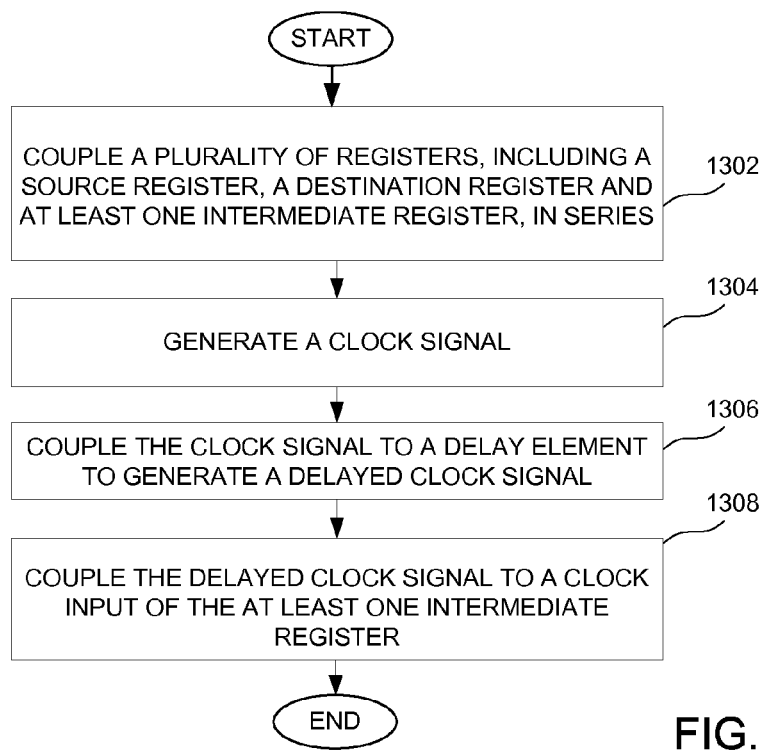
FIG. 13 is a flow chart showing a method of routing signals in an integrated circuit.

Turning now to FIG. 13, a flow chart shows a method of generating routing signals in an integrated circuit. In particular, a plurality of registers, including a source register, a destination register and at least one intermediate register, are coupled in series at a step 1302. A clock signal is generated at a step 1304, and is coupled to a delay element to generate a delayed clock signal at a step 1306. The delayed clock signal is then coupled to a clock input of the at least one intermediate register at a step 1302.

Figure 14:
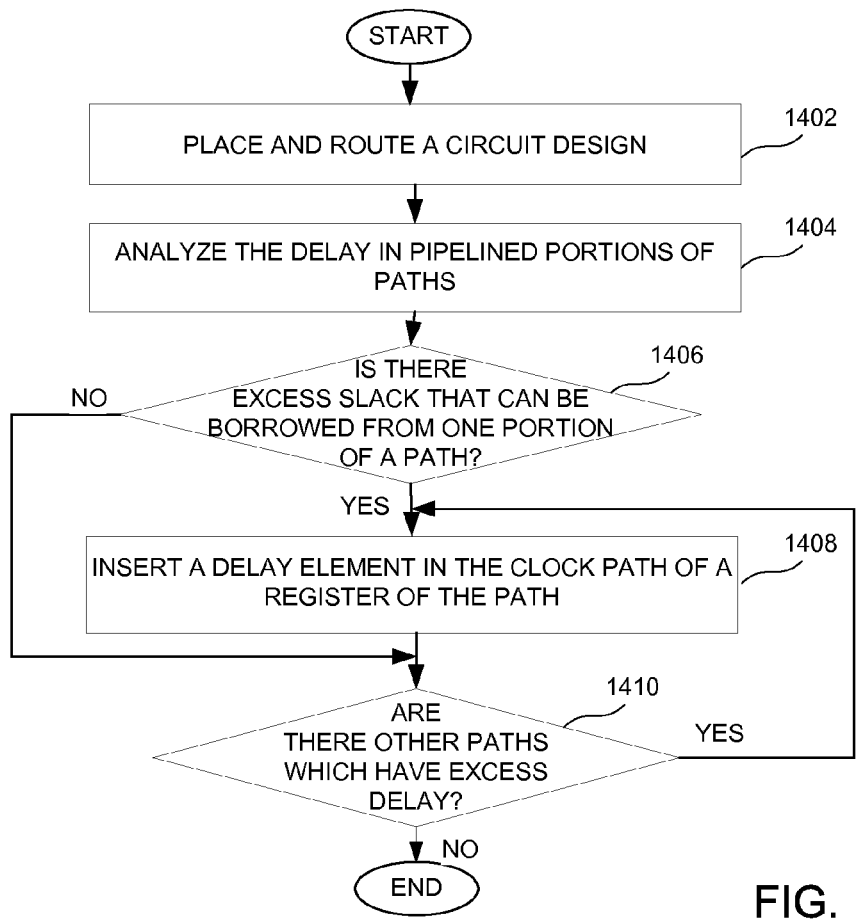
FIG. 14 is a flow chart showing a method of modifying a circuit design to improve the operating frequency of the circuit design.

Turning now to FIG. 14, a flow chart shows a method of modifying a circuit design to improve the operating frequency of the circuit design. A circuit design is placed and routed at a step 1402. The delays in pipelined portions of paths are analyzed at a step 1404. It is then determined whether is there excess slack that can be borrowed from one portion of a path at a step 1406. A delay element is inserted in the clock path of a register of the path at a step 1408. It is then determined whether there are other paths which have excess delay at a step 1410.

Figure 15:
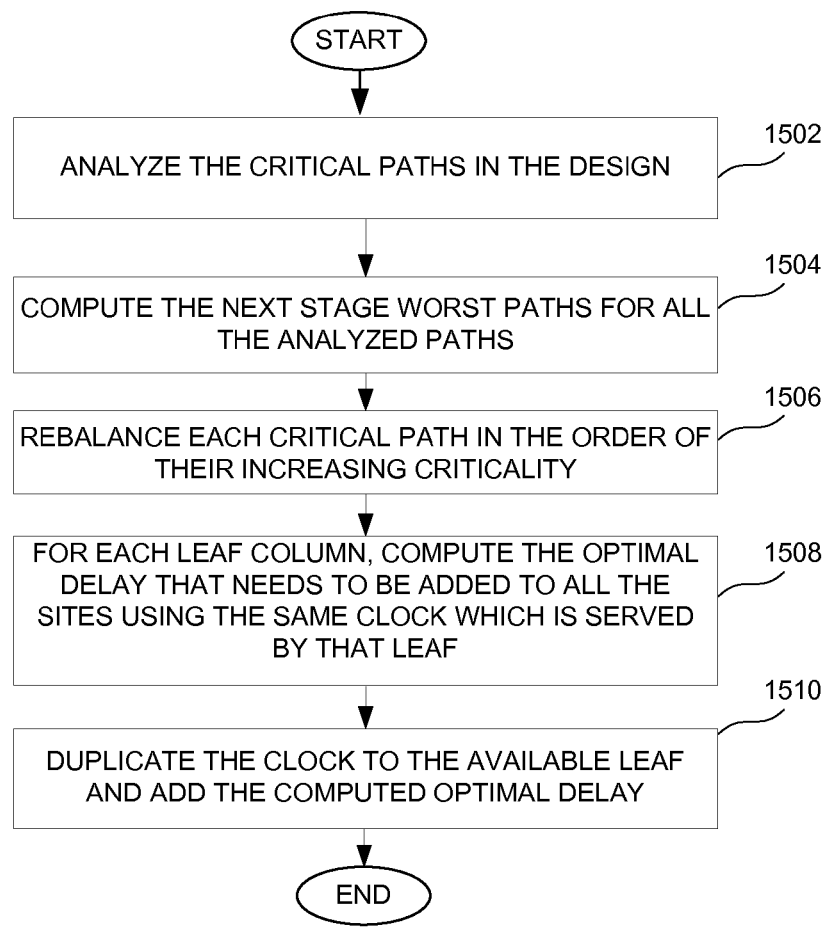
FIG. 15 is a flow chart showing a method of providing an optimum delay in a data path.

Turning now to FIG. 15, a flow chart shows a method of providing optimum delay in a data path. The critical paths in the design are analyzed at a step 1502. The next stage worst paths for all the analyzed paths are computed at a step 1504. For example, if one pipeline stage of the data path is a 10 nanosecond (nsec) path, and the following stage is a 5 nsec path, 2½ nanoseconds can be borrowed from the second stage so that each stage of the path has a 7½ nsec delay. Each critical path is rebalanced in the order of their increasing criticality at a step 1506. That is, delay elements are added (as set forth above in FIG. 3 for example) so that the first and second portions of the data path have a 7½ nsec delay. For each leaf column, the optimal delay that needs to be added to all the sites is computed using the same clock which is provided to that leaf at a step 1508. The clock to the available leaf is duplicated (such as on an unused clock branch) and the computed optimal delay is added at a step 1510. The optimal delay and duplication of the clock could be provided as described above with respect to FIG. 4.

The various elements of the methods of FIGS. 13-15 may be implemented using the circuits of FIGS. 1-12 as described, or using some other suitable circuits. While specific elements of the method are described, it should be understood that additional elements of the method, or additional details related to the elements, could be implemented according to the disclosure of FIGS. 1-12.

It can therefore be appreciated that new circuits for and methods of routing signals in an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:
1. A circuit for routing signals in an integrated circuit device, the circuit comprising:

a path having a plurality of registers coupled in series and including a source register, a destination register and at least one intermediate register each having a clock input;

a clock generator, connected to the clock input of the source register and the clock input of the destination register, generating a clock signal, wherein the clock signal is received at the clock input of the source register and the clock input of the destination register; and a delay element coupled to receive the clock signal and generate a delayed clock signal, wherein the delayed clock signal is received at the clock input of the at least one intermediate register.

2. The circuit of claim 1, further comprising a plurality of intermediate registers coupled in series between the source register and the destination register, wherein the delayed clock signal is received at a predetermined intermediate register of the plurality of intermediate registers.

3. The circuit of claim 1, wherein a first portion of the path has reduced timing slack and a second portion of the path has excess timing slack.

4. The circuit of claim 3, wherein the delay element provides a delayed clock signal which enables the first portion of the path to borrow timing slack from the second portion of the path.

5. The circuit of claim 1, wherein the delay element is associated with a branch of a clock tree coupled to the clock generator.

6. The circuit of claim 1, further comprising a plurality of delay elements, wherein each delay element is associated with a different branch of a clock tree coupled to the clock generator.

7. The circuit of claim 1, wherein the delay element comprises a programmable delay element.

8. A circuit for routing signals in an integrated circuit device, the circuit comprising:

a clock generator generating a clock signal;

a clock tree coupled to the clock generator, the clock tree having a plurality of clock branches;

a plurality of registers of a data path coupled in series and including a source register, a destination register, and at least one intermediate register, each register having a clock input; and programmable interconnect elements coupled to the clock tree, the programmable interconnect elements connecting the clock signal to both the clock input of the source register and the clock input of the destination register to enable the source register and the destination register to receive the clock signal, and further connecting a delayed clock signal to the at least one intermediate register of the plurality of registers to enable the at least one intermediate register to receive the delayed clock signal.

9. The circuit of claim 8, further comprising a delay element coupled to receive the clock signal, wherein the delayed clock signal is generated by the delay element.

10. The circuit of claim 9, further comprising a plurality of intermediate registers, wherein the delayed clock signal is coupled to a predetermined intermediate register of the plurality of intermediate registers.

11. The circuit of claim 9, wherein a first portion of the path has reduced timing slack and a second portion of the path has excess timing slack.

12. The circuit of claim 11, wherein the delay element provides a delayed clock signal which enables the first portion of the path to borrow timing slack from the second portion of the path.

13. The circuit of claim 9, wherein the delay element comprises a programmable delay element.

14. A method of routing signals in an integrated circuit device, the method comprising:

coupling a plurality of registers, including a source register, a destination register and at least one intermediate register, in series, wherein each register of the plurality of registers has a clock input;

generating a clock signal;

receiving the clock signal at the clock input of the source register and the clock input of the destination register;

receiving the clock signal at a delay element to generate a delayed clock signal; and receiving the delayed clock signal at the clock input of the at least one intermediate register.

15. The method of claim 14, wherein coupling the delayed clock signal to the clock input of the at least one intermediate register comprises coupling the delayed clock signal to a predetermined intermediate register of a plurality of intermediate registers.

16. The method of claim 14, further comprising identifying reduced timing slack in a first portion of a path and excess timing slack in a second portion of a path.

17. The method of claim 16, further comprising enabling the first portion of the path to borrow slack from the second portion of the path.

18. The method of claim 14, further comprising providing delay element which is associated with a branch of a clock tree coupled to the clock signal.

19. The method of claim 18, further comprising programming a delay of the delay element.

20. The method of claim 14, further comprising providing a plurality of delay elements, wherein each delay element is associated with a branch of a clock tree coupled to a clock generator.

* * * * *